(12) United States Patent
Shida et al.

(10) Patent No.: US 10,018,908 B2
(45) Date of Patent: Jul. 10, 2018

(54) PATTERN FORMING METHOD

(71) Applicant: Toshiba Memory Corporation, Tokyo (JP)

(72) Inventors: Naomi Shida, Tokyo (JP); Kenji Todori, Yokohama (JP); Shigehiko Mori, Kawasaki (JP); Reiko Yoshimura, Kawasaki (JP); Hiroyuki Kashiwagi, Fujisawa (JP); Ikuo Yoneda, Yokohama (JP); Tsukasa Tada, Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/412,121

(22) Filed: Jan. 23, 2017

(65) Prior Publication Data

US 2017/0131630 A1    May 11, 2017

Related U.S. Application Data

(63) Continuation of application No. 14/571,385, filed on Dec. 16, 2014, now Pat. No. 9,588,418, which is a
(Continued)

(30) Foreign Application Priority Data

Mar. 30, 2012    (JP) ................................ 2012-081893

(51) Int. Cl.
*G03F 1/38* (2012.01)
*G03F 7/20* (2006.01)
(Continued)

(52) U.S. Cl.
CPC .................. *G03F 1/76* (2013.01); *G03F 7/16* (2013.01); *G03F 7/201* (2013.01); *G03F 7/40* (2013.01);
(Continued)

(58) Field of Classification Search
None
See application file for complete search history.

(56) References Cited

U.S. PATENT DOCUMENTS

| 6,338,924 B1 | 1/2002 | Tsuruma et al. |
| 8,419,950 B2 | 4/2013 | Kashiwagi et al. |

(Continued)

FOREIGN PATENT DOCUMENTS

| JP | 10-48810 A | 2/1998 |
| JP | 2001-66762 A | 3/2001 |

(Continued)

OTHER PUBLICATIONS

Office Action dated Jun. 10, 2014 in Japanese Patent Application No. 2012-081893 (with English language translation).

(Continued)

*Primary Examiner* — Stephen Rosasco
(74) *Attorney, Agent, or Firm* — Oblon, McClelland, Maier & Neustadt, L.L.P.

(57) ABSTRACT

A near-field exposure mask according to an embodiment includes: a substrate; a concave-convex structure having convexities and concavities and formed on one surface of the substrate; a near-field light generating film arranged at least on a tip portion of each of the convexities, the near-field light generating film being a layer containing at least one element selected from the group consisting of Au, Al, Ag, Cu, Cr, Sb, W, Ni, In, Ge, Sn, Pb, Zn, Pd, and C, or a film stack formed with layers made of some of those materials; and a resin filled in each of the concavities.

15 Claims, 15 Drawing Sheets

Related U.S. Application Data continuation of application No. 13/755,188, filed on Jan. 31, 2013, now Pat. No. 8,945,798.

- (51) Int. Cl.
  - *G03F 1/76* (2012.01)
  - *H01L 21/308* (2006.01)
  - *H01L 21/3065* (2006.01)
  - *G03F 7/16* (2006.01)
  - *G03F 7/40* (2006.01)
- (52) U.S. Cl.
  CPC ...... *H01L 21/3065* (2013.01); *H01L 21/3086* (2013.01)

(56) References Cited

U.S. PATENT DOCUMENTS

| | | |
|---|---|---|
| 2010/0308513 A1 | 12/2010 | Kashiwagi et al. |
| 2012/0228804 A1 | 9/2012 | Shida et al. |

FOREIGN PATENT DOCUMENTS

| | | |
|---|---|---|
| JP | 2006-287012 A | 10/2006 |
| JP | 2010-287625 | 12/2010 |
| JP | 2011-71237 A | 4/2011 |
| JP | 2012-190915 | 10/2012 |

OTHER PUBLICATIONS

Office Action dated Dec. 2, 2014, in corresponding Japanese Patent Application No. 2012-081893, (with English-language Translation).

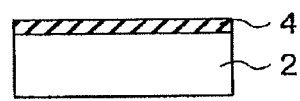
FIG. 1A  FIG. 1B
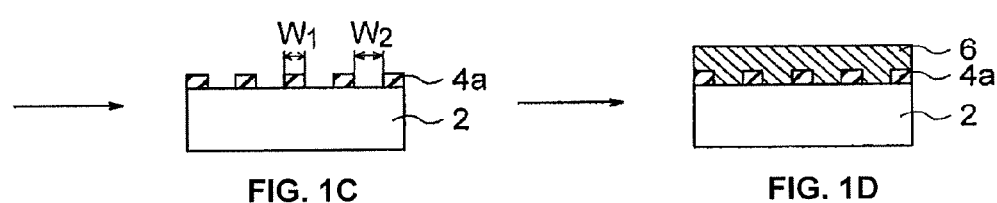
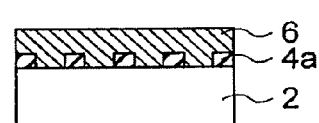
FIG. 1C  FIG. 1D
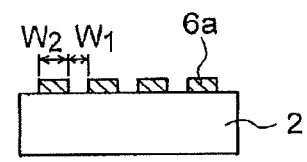
FIG. 2A  FIG. 2B
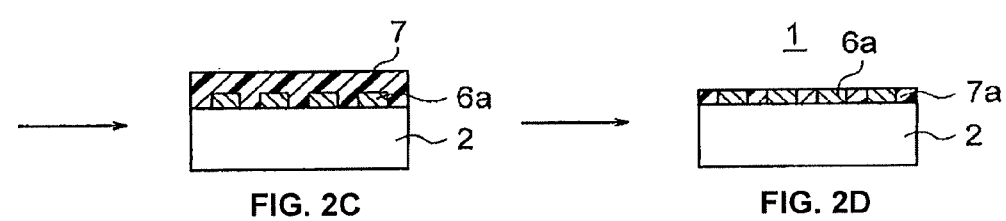
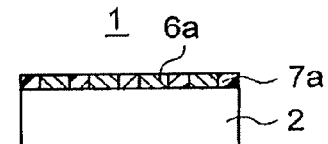
FIG. 2C  FIG. 2D

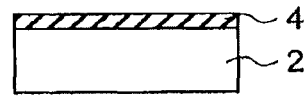
FIG. 5A  FIG. 5B
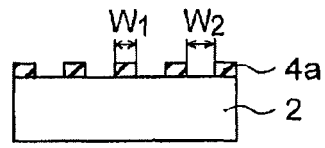
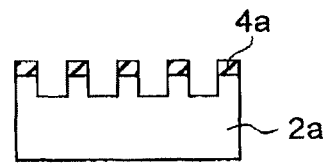
FIG. 5C  FIG. 5D
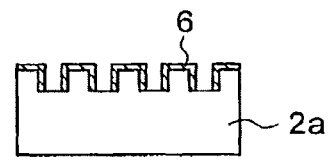
FIG. 6A  FIG. 6B
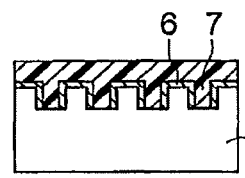
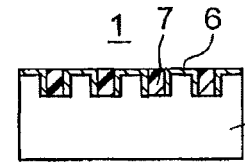
FIG. 6C  FIG. 6D

VAPOR DEPOSITION,SPUTTERING,MBE, OR THE LIKE FROM DIAGONALLY LEFT

VAPOR DEPOSITION,SPUTTERING,MBE OR THE LIKE FROM DIAGONALLY RIGHT

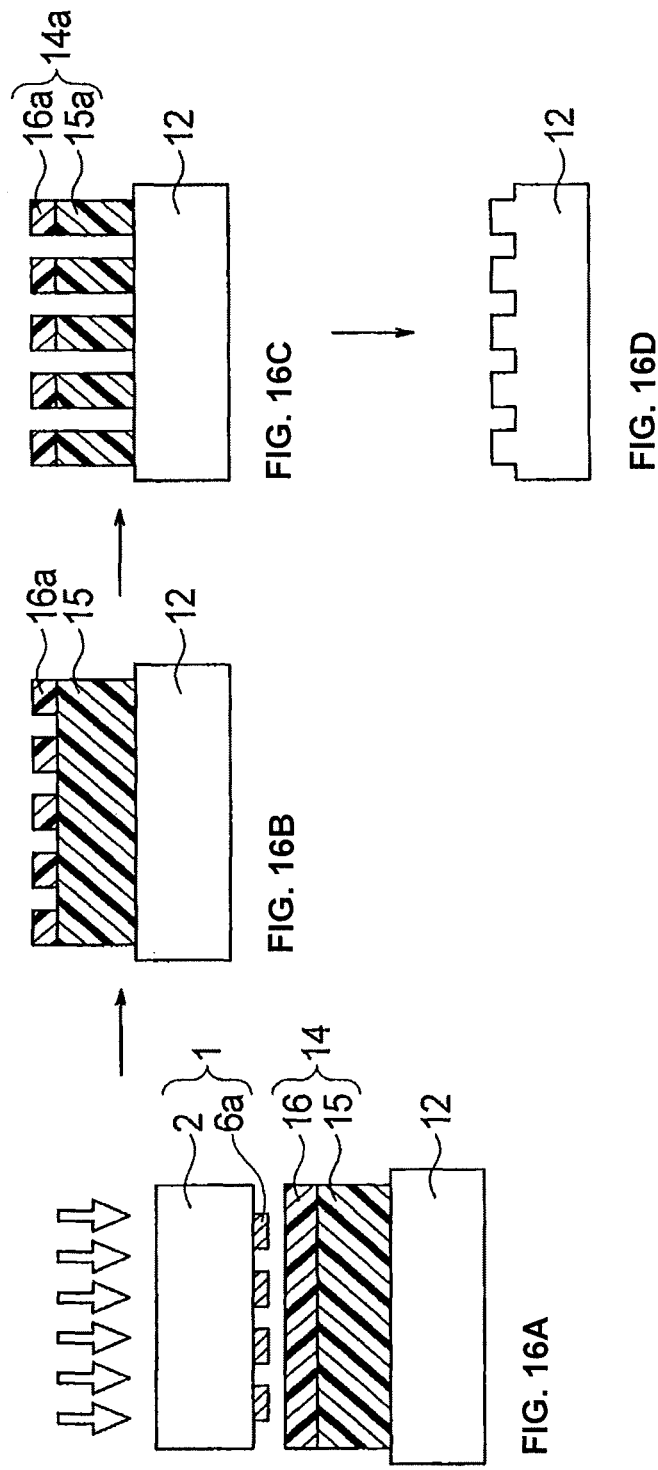

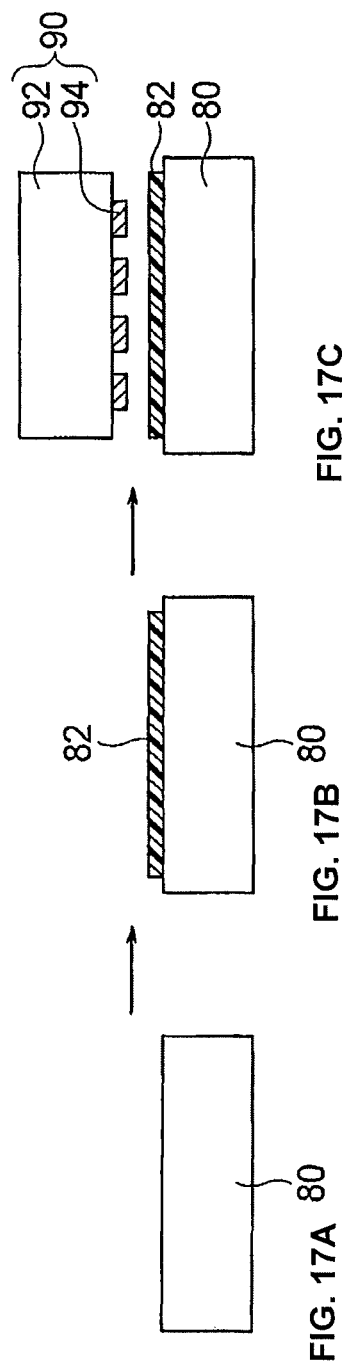
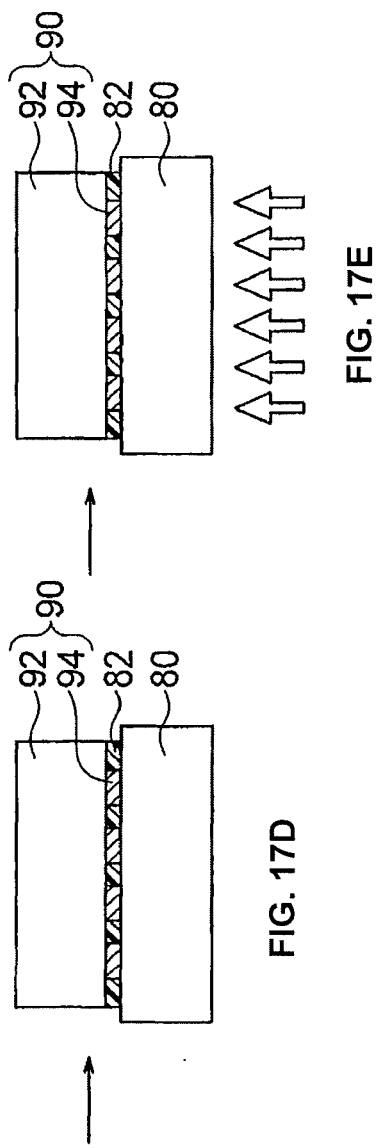

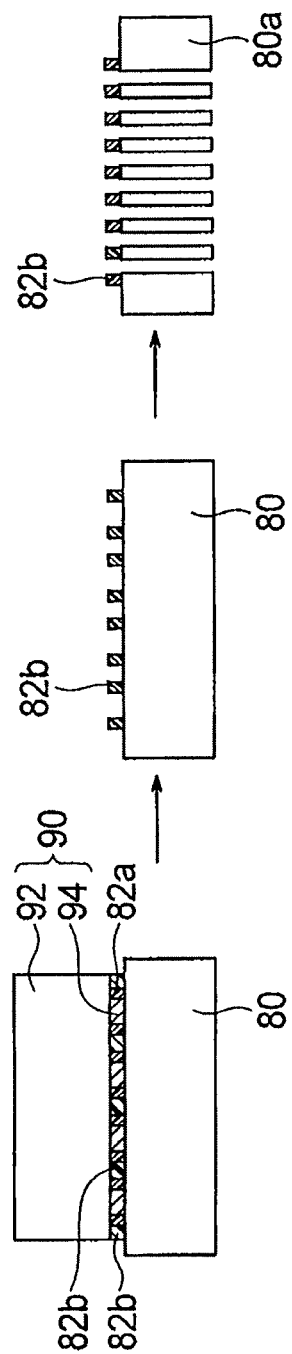

PATTERN FORMING METHOD

CROSS REFERENCE TO RELATED APPLICATIONS

This application is a continuation of U.S. application Ser. No. 14/571,385, filed Dec. 16, 2014, now allowed; which is a continuation of U.S. application Ser. No. 13/755,188, filed Jan. 31, 2013, now U.S. Pat. No. 8,945,798; and based upon and claims the benefit of priority from prior Japanese Patent Application No. 2012-081893 filed on Mar. 30, 2012 in Japan, the entire contents of which are incorporated herein by reference.

FIELD

Embodiments described herein relate generally to a near-field exposure mask and a pattern forming method.

BACKGROUND

In recent years, there have been increasing demands for devices with higher densities and higher integration degrees in the fields of various electronic devices that require fine processing, such as semiconductor devices. To satisfy those demands, formation of finer patterns of wiring etc. is essential. In procedures for manufacturing such semiconductor devices, the photolithography technology plays an important role in the formation of fine patterns.

Further, there has been a demand for higher-density microfabrication of semiconductor packages, interposers, printed circuit boards, and the like, as semiconductors have been made to have smaller sizes, higher densities, and higher speeds.

Particularly, in recent years, at the time of formation of a storage media fine structure pattern or formation of a biochip nanostructure, high-density microfabrication is more and more strongly required. As a mass-production means to satisfy such a technical demand, the nanoimprint technology has been studied in recent years.

The nanoimprint technology has been developed by applying a pressing method using a metal mold to the nanoscale technology, and involves a nanoscale mold processing technique for performing molding by pressing a mold with minute concavities and convexities against an object to be processed. By the nanoimprint technology, patterns with a width of several tens of nanometers can be formed. Compared with an equivalent processing technology using an electron beam, the nanoimprint technology has the advantage that a large number of patterns can be molded at very low costs.

In the nanoimprint technology, the use of near-field light has been suggested. Generally, in the nanoimprint technology, a mold with concavities and convexities is pressed against a substrate, on which a light-curable resin is applied, and exposed to ultraviolet to cure the light-curable resin. Since the mold that is pressed against the light-curable resin is exposed to ultraviolet, there is a problem in that the mold releasability is low when the mold is removed from the resin after it is exposed to ultraviolet.

Furthermore, it is required to improve the adhesion between the template and the substrate when transferring the ultrafine pattern. Thus, it cannot be said that a sufficient study has been performed in the optimization of pattern forming method.

BRIEF DESCRIPTION OF THE DRAWINGS

FIGS. 1A through 1D are cross-sectional views illustrating a procedure of manufacturing a near-field exposure mask according to a first embodiment.

FIGS. 2A through 2D are cross-sectional views illustrating a procedure of manufacturing a near-field exposure mask according to the first embodiment.

FIGS. 5A through 5D are cross-sectional views illustrating a procedure of manufacturing a near-field exposure mask according to a third embodiment.

FIGS. 6A through 6D are cross-sectional views illustrating a procedure of manufacturing a near-field exposure mask according to the third embodiment.

FIGS. 16A through 16D are cross-sectional views illustrating a resist pattern forming method and a device manufacturing method according to a twelfth embodiment.

FIGS. 17A through 17E are cross-sectional views for explaining a pattern forming method according to a thirteenth embodiment.

FIGS. 18A through 18C are cross-sectional views for explaining the pattern forming method according to the thirteenth embodiment.

DETAILED DESCRIPTION

Figure 3A:
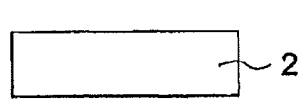
FIGS. 3A through 3D are cross-sectional views illustrating a procedure of manufacturing a near-field exposure mask according to a second embodiment.

A near-field exposure mask according to an embodiment includes: a substrate; a concave-convex structure having convexities and concavities and formed on one surface of the substrate; a near-field light generating film arranged at least on a tip portion of each of the convexities, the near-field light generating film being a layer containing at least one element selected from the group consisting of Au, Al, Ag, Cu, Cr, Sb, W, Ni, In, Ge, Sn, Pb, Zn, Pd, and C, or a film stack formed with layers made of some of those materials; and a resin filled in each of the concavities.

The following is a description of embodiments, with references to the accompanying drawings.

First Embodiment

Referring to FIGS. 1A through 2D, a near-field exposure mask (hereinafter also referred to as "near-field generating member") according to a first embodiment is described. FIGS. 1A through 2D are cross-sectional views illustrating the procedures for manufacturing the near-field exposure mask according to the first embodiment.

First, a silicon substrate 2 of 600 μm in thickness is prepared, and a resist layer 4 of 10 nm to 30 nm in thickness, for example, is applied onto the silicon substrate 2 (FIGS. 1A and 1B). A resist pattern 4a is then formed in the resist layer 4 by using an electron beam lithography technique or an Extreme Ultra-Violet (EUV) lithography technique (FIG. 1C). This resist pattern 4a is a line-and-space pattern in which the line width $W_1$ is 10 nm, and the space width $W_2$ is 10 nm, for example. Accordingly, the height of the resist pattern 4a is 10 nm to 30 nm.

After that, a near-field light generating film 6 is deposited on the resist pattern 4a, to fill the spaces in the resist pattern 4a (FIG. 1D). The near-field light generating film 6 may be a layer containing at least one element selected from the group consisting of Au, Al, Ag, Cu, Cr, Sb, W, Ni, In, Ge, Sn, Pb, Zn, Pd, and C, or a film stack formed with layers made of some of those materials.

By using Chemical Mechanical Polishing (CMP), the near-field light generating film 6 is polished, and the upper surface of the resist pattern 4a is exposed (FIG. 2A). As a result, a near-field light generating film pattern 6a, which is obtained by filling the near-field light generating film in concavities of the resist pattern 4a on the silicon substrate 2, is formed (FIG. 2A). Thereafter, the resist pattern 4a is removed by using resist remover. In this manner, the near-field light generating film 6a having concavities and convexities is left on the silicon substrate 2. The near-field light generating film pattern 6a is a line-and-space pattern in which the line width $W_2$ is 10 nm, and the space width $W_1$ is 10 nm. Accordingly, the height (the thickness) of the lines in the near-field light generating film pattern 6a is 10 nm to 30 nm. The height (the thickness) of the lines in the near-field light generating film pattern 6a is 100 nm or smaller so that near-field light reaches the resist to be exposed, but is preferably 50 nm or smaller. Alternatively, the near-field light generating film pattern 6a may be a pattern in which the line width $W_2$ is 5 nm or greater, and the space width $W_1$ is 5 nm or greater. It should be noted that the preferred sizes in the near-field light generating film pattern 6a vary with devices to be formed by using the near-field exposure mask.

Then, a thermosetting resin 7, for example silicon resin, is deposited on the silicon substrate, on which the near-field light generating film pattern 6a is formed, by a potting method, for example, and cured by a heating process at a temperature of 150° C. (FIG. 2C). The method of forming the thermosetting resin 7 is not limited to the potting method, but can be any other method. Thereafter, the thermosetting resin 7 is polished by using CMP to expose the upper surface of the near-field light generating film pattern 6a, thereby forming a near-field exposure mask 1 (FIG. 2D).

The near-field exposure mask 1 thus formed includes a near-field light generating film pattern 6a with concavities and convexities formed on the silicon substrate 2, and a resin 7a filled in the concavities of the near-field light generating film pattern. Accordingly, if the near-field exposure mask 1 of this embodiment is pressed against a light-curable resin which is formed on a substrate and on which a pattern has been transferred, and exposed to a light to perform a nanoimprint process by means of a near-field light, it is possible to prevent the light-curable resin from being filled into the concavities of the near-field light generating film pattern 6a. Incidentally, a material with a high mold releasability is selected for the light-curable resin to be formed on the substrate, on which a pattern is transferred, and the resin 7a to be filled into the concavities of the near-field light generating film pattern. As a result, using the near-field exposure mask 1, it is possible to prevent the degradation of the resolution of the pattern to be transferred even if the nanoimprint process is repeatedly performed.

A silicon resin, an epoxy resin, and so on can be used as the thermosetting resin. Furthermore, instead of a thermosetting resin, a light-curable resin can be used.

As the substrate, a glass substrate can be used in addition to the silicon substrate.

As described above, according to this embodiment, it is possible to provide a pattern forming method by which it is possible to transfer an ultrafine pattern onto a substrate with a high accuracy.

In this embodiment, the near-field exposure mask 1 is formed with the silicon substrate 2, the near-field light generating film pattern 6a, and the resin 7a. Accordingly, the durability can be increased, and the near-field exposure mask 1 can be formed through simple manufacturing procedures.

Second Embodiment

Referring now to FIG. 3A though 4D, a near-field exposure mask according to a second embodiment is described. FIG. 3A though 4D are cross-sectional views illustrating a procedure of manufacturing a near-field exposure mask according to the second embodiment.

Figure 3B:
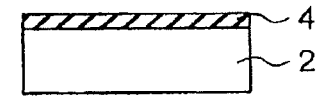
Figure 3C:
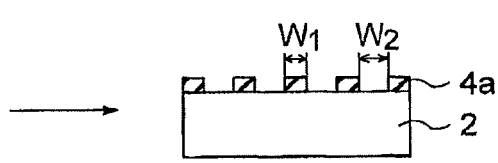
Figure 3D:
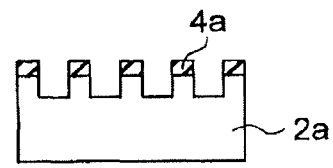

First, a silicon substrate 2 of 600 μm in thickness is prepared, and a resist layer 4 of 10 nm to 30 nm in thickness, for example, is applied onto the silicon substrate 2 (FIGS. 3A and 3B). A resist pattern 4a is then formed in the resist layer 4 by using an electron beam lithography technique or an EUV lithography technique (FIG. 3C). This resist pattern 4a is a line-and-space pattern in which the line width $W_1$ is 10 nm, and the space width $W_2$ is 10 nm, for example. Accordingly, the height of the resist pattern 4a is 10 nm to 30 nm. Thereafter, the silicon substrate 2 is etched by means of Reactive Ion Etching (RIE) using the resist pattern 4a as a mask (FIG. 3D). As a result, a silicon substrate 2a having a pattern of concavities and convexities on its surface is obtained (FIG. 3D). The pattern of concavities and convexities of the silicon substrate 2a is a line-and-space pattern in which the line width is $W_2$ and the space width is $W_2$.

Figure 4A:
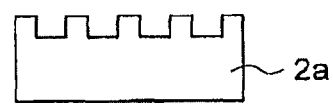
FIGS. 4A through 4D are cross-sectional views illustrating a procedure of manufacturing a near-field exposure mask according to the second embodiment.
Figure 4B:
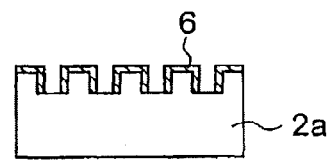

By removing the resist pattern 4a, it is possible to obtain a silicon substrate 2a with an ultrafine pattern (FIG. 4A). A near-field light generating film 6 is deposited on at least a top surface (tip portion) and sides of each of the convexities of the pattern of concavities and convexities of the silicon substrate 2a (FIG. 4B). Although it is not shown in the drawings, the near-field light generating film 6 can also be deposited on the bottoms of the concavities. The near-field light generating film 6 may be a layer containing at least one element selected from the group consisting of Au, Al, Ag, Cu, Cr, Sb, W, Ni, In, Ge, Sn, Pb, Zn, Pd, and C, or a film stack formed with layers made of some of those materials. Furthermore, the thickness of the near-field light generating film 6 on the tip portion is from 2 nm to 80 nm, and preferably, from 5 nm to 40 nm.

In order to deposit the near-field light generating film 6, the direction of the irradiation source is set to be diagonal relative to plane of the substrate, and the deposition is performed from both the right and left directions. Typical deposition methods are vapor deposition, sputtering, and Molecular Beam Epitaxy (MBE), but the deposition method to be used here is not limited thereto. By adjusting the irradiation angle relative to the direction of the irradiation source, it is possible to adjust the thickness or thickness ratio of the near-field light generating film 6 to be formed on the top surface and the sides of each of the concavities.

Figure 4C:
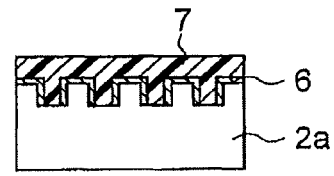
Figure 4D:
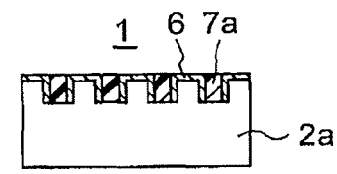

Then, a thermosetting resin 7, for example silicon resin, is deposited on an upper surface of the substrate 2, on which the near-field light generating film 6 is formed, by a potting method, for example, and cured by a heating process at a temperature of 150° C. (FIG. 4C). The method of depositing the thermosetting resin is not limited to the potting method, but can be any other method. Thereafter, the thermosetting resin 7 is polished by CMP to expose the upper surface of the near-field light generating film 6, thereby forming a near-field exposure mask 1 (FIG. 4D).

In the near-field exposure mask 1 thus formed, a near-field light generating film 6 is formed on at least the top surface and the sides of each of the convexities of the pattern of concavities and convexities formed on the surface of the silicon substrate, and a resin 7a is filled in the concavities of the pattern of concavities and convexities. Accordingly, if the near-field exposure mask 1 of this embodiment is pressed against a light-curable resin which is formed on a substrate and on which a pattern has been transferred, and exposed to a light to perform a nanoimprint process by means of a near-field light, it is possible to prevent the light-curable resin from being filled into the concavities of the pattern of concavities and convexities. Incidentally, a material with a high mold releasability is selected for the light-curable resin to be formed on the substrate, on which a pattern is transferred, and the resin 7a to be filled into the concavities of the near-field light generating film pattern. As a result, using the near-field exposure mask 1, it is possible to prevent the degradation of the resolution of the pattern to be transferred even if the nanoimprint process is repeatedly performed.

A silicon resin, an epoxy resin, and so on can be used as the thermosetting resin. Furthermore, instead of a thermosetting resin, a light-curable resin can be used.

As the substrate, a glass substrate can be used in addition to the silicon substrate.

As described above, according to this embodiment, it is possible to provide a pattern forming method by which it is possible to transfer an ultrafine pattern onto a substrate with a high accuracy.

In this embodiment, the near-field exposure mask 1 is formed with the silicon substrate 2a, the near-field light generating film pattern 6a, and the resin 7a. Accordingly, the durability can be increased, and the near-field exposure mask 1 can be formed through simple manufacturing procedures.

Third Embodiment

Referring now to FIG. 5A though 6D, a near-field exposure mask according to a third embodiment is described. FIG. 5A though 6D are cross-sectional views illustrating a procedure of manufacturing a near-field exposure mask according to the third embodiment.

First, a silicon substrate 2 of 600 μm in thickness is prepared, and a resist layer 4 of 10 nm to 30 nm in thickness, for example, is applied onto the silicon substrate 2 (FIGS. 5A and 5B). A resist pattern 4a is then formed in the resist layer 4 by using an electron beam lithography technique or EUV lithography technique (FIG. 5C). This resist pattern 4a is a line-and-space pattern in which the line width $W_1$ is 10 nm, and the space width $W_2$ is 10 nm, for example. Accordingly, the height of the resist pattern 4a is 10 nm to 30 nm. Thereafter, the silicon substrate 2 is etched by means of RIE using the resist pattern 4a as a mask (FIG. 5C). As a result, a silicon substrate 2a having a pattern of concavities and convexities on its surface can be obtained (FIG. 5D). The pattern of concavities and convexities of the silicon substrate 2a is a line-and-space pattern in which the line width is $W_2$ and the space width is $W_1$.

By removing the resist pattern 4a, it is possible to obtain a silicon substrate 2a with an ultrafine pattern (FIG. 6A). A near-field light generating film 6 is deposited on a top surface and part of sides connecting to the top surface of each of the convexities of the pattern of concavities and convexities of the silicon substrate 2a (FIG. 6B). The near-field light generating film 6 may be a layer containing at least one element selected from the group consisting of Au, Al, Ag, Cu, Cr, Sb, W, Ni, In, Ge, Sn, Pb, Zn, Pd, and C, or a film stack formed with layers made of some of those materials.

In order to deposit the near-field light generating film 6, the direction of the irradiation source is set to be diagonal relative to plane of the substrate, and the deposition is performed from both the right and left directions. Typical deposition methods are vapor deposition, sputtering, and MBE, but the deposition method to be used here is not limited thereto. By adjusting the irradiation angle relative to the direction of the irradiation source, it is possible to adjust the thickness or thickness ratio of the near-field light generating film 6 to be formed on the top surface and the sides of each of the concavities.

Then, a thermosetting resin 7, for example silicon resin, is deposited on an upper surface of the substrate 2, on which the near-field light generating film pattern 6 is formed, by a potting method, for example, and cured by a heating process at a temperature of 150° C. (FIG. 6C). The method of depositing the thermosetting resin is not limited to the potting method, but can be any other method. Thereafter, the thermosetting resin 7 is polished by CMP to expose the upper surface of the near-field light generating film 6, thereby forming a near-field exposure mask 1 (FIG. 6D).

In the near-field exposure mask 1 thus formed, a near-field light generating film 6 is formed on at least the top surface and part of the sides connecting to the top surface of each of the convexities of the pattern of concavities and convexities formed on the surface of the silicon substrate, and a resin 7a is filled in the concavities of the pattern of concavities and convexities. Accordingly, if the near-field exposure mask 1 of this embodiment is pressed against a light-curable resin which is formed on a substrate and on which a pattern has been transferred, and exposed to a light to perform a nanoimprint process by means of a near-field light, it is possible to prevent the light-curable resin from being filled into the concavities of the pattern of concavities and convexities. Incidentally, a material with a high mold releasability is selected for the light-curable resin to be formed on the substrate, on which a pattern is transferred, and the resin 7a to be filled into the concavities of the near-field light generating film pattern. As a result, using the near-field exposure mask 1, it is possible to prevent the degradation of the resolution of the pattern to be transferred even if the nanoimprint process is repeatedly performed.

A silicon resin, an epoxy resin, and so on can be used as the thermosetting resin. Furthermore, instead of a thermosetting resin, a light-curable resin can be used.

As the substrate, a glass substrate can be used in addition to the silicon substrate.

As described above, according to this embodiment, it is possible to provide a pattern forming method by which it is possible to transfer an ultrafine pattern onto a substrate with a high accuracy.

In this embodiment, the near-field exposure mask 1 is formed with the silicon substrate 2a, the near-field light generating film pattern 6a, and the resin 7a. Accordingly, the durability can be increased, and the near-field exposure mask 1 can be formed through simple manufacturing procedures.

Fourth Embodiment

Figure 7A:
FIGS. 7A through 7F are cross-sectional views illustrating a procedure of manufacturing a near-field exposure mask according to a fourth embodiment.
Figure 7B:
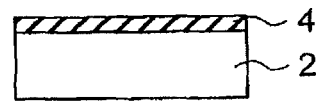

Referring now to FIG. 7A though 7F, a near-field exposure mask according to a fourth embodiment is described. FIG. 7A though 7F are cross-sectional views illustrating a procedure of manufacturing a near-field exposure mask according to the fourth embodiment.

Figure 7C:
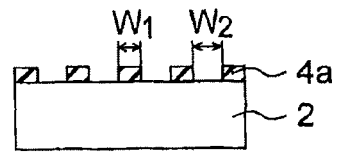
Figure 7D:
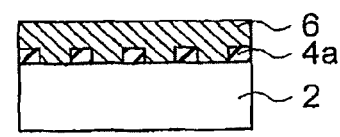

First, a silicon substrate 2 of 600 μm in thickness is prepared, and a resist layer 4 of 10 nm to 30 nm in thickness, for example, is applied onto the silicon substrate 2 (FIGS. 7A and 7A). A resist pattern 4a is then formed in the resist layer 4 by using an electron beam lithography technique or EUV lithography technique (FIG. 7C). This resist pattern 4a is a line-and-space pattern in which the line width $W_1$ is 10 nm, and the space width $W_2$ is 10 nm, for example. Accordingly, the height of the resist pattern 4a is 10 nm to 30 nm. Thereafter, a near-field light generating film 6 is deposited on the resist pattern 4a so as to fill the spaces (concavities) of the resist pattern 4a (FIG. 7D). The near-field light generating film 6 may be a layer containing at least one element selected from the group consisting of Au, Al, Ag, Cu, Cr, Sb, W, Ni, In, Ge, Sn, Pb, Zn, Pd, and C, or a film stack formed with layers made of some of those materials.

Figure 7E:
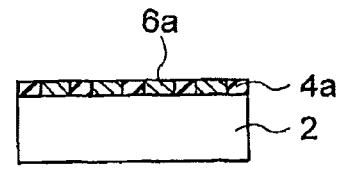

Thereafter, the near-field light generating film 6 is polished by using CMP to expose the upper surface of the resist pattern 4a, thereby leaving a near-field light generating film 6a in the spaces (concavities) of the resist pattern 4a (FIG. 7E).

Figure 7F:
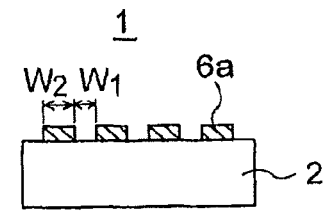

Then, the resist pattern 4a is removed using a resist removing agent to form a near-field exposure mask 1 (FIG. 7F). As a result, a line-and-space pattern, which is formed of the near-field light generating film 6a, and in which the width of the lines (convexities) is $W_2$ and the width of the spaces (concavities) is $W_1$, is formed on the silicon substrate 2.

In the near-field exposure mask 1 thus formed, a pattern of concavities and convexities formed of the near-field light generating film 6 is formed on the silicon substrate.

As the substrate, a glass substrate can be used in addition to the silicon substrate.

As will be described later in the descriptions of the ninth embodiment, according to this embodiment, it is possible to provide a pattern forming method by which it is possible to transfer an ultrafine pattern onto a substrate with a high accuracy.

In this embodiment, the near-field exposure mask 1 is formed of the silicon substrate 2 and the near-field light generating film 6a. Accordingly, the durability can be increased, and the near-field exposure mask 1 can be formed through simple manufacturing procedures.

Fifth Embodiment

Figure 8A:
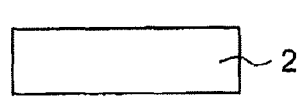
FIGS. 8A through 8F are cross-sectional views illustrating a procedure of manufacturing a near-field exposure mask according to a fifth embodiment.

Referring now to FIG. 8A though 8F, a near-field exposure mask according to a fifth embodiment is described. FIG. 8A though 8F are cross-sectional views illustrating a procedure of manufacturing a near-field exposure mask according to the fifth embodiment.

Figure 8B:
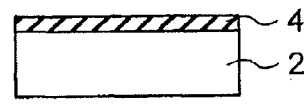
Figure 8C:
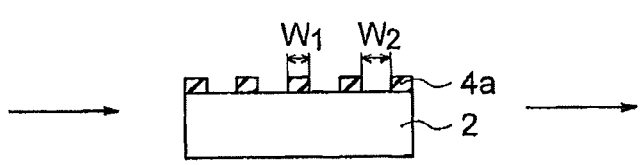
Figure 8D:
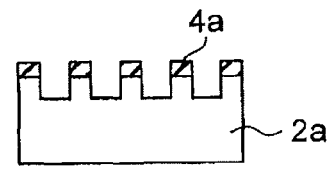

First, a silicon substrate 2 of 600 μm in thickness is prepared, and a resist layer 4 of 10 nm to 30 nm in thickness, for example, is applied onto the silicon substrate 2 (FIGS. 8A and 8B). A resist pattern 4a is then formed in the resist layer 4 by using an electron beam lithography technique or EUV lithography technique (FIG. 8C). This resist pattern 4a is a line-and-space pattern in which the line width $W_1$ is 10 nm, and the space width $W_2$ is 10 nm, for example. Accordingly, the height of the resist pattern 4a is 10 nm to 30 nm. Thereafter, the silicon substrate 2 is etched by means of RIE using the resist pattern 4a as a mask (FIG. 8D). As a result, a silicon substrate 2a having a pattern of concavities and convexities on its surface can be obtained (FIG. 8D). The pattern of concavities and convexities of the silicon substrate 2a is a line-and-space pattern in which the line width is $W_2$ and the space width is $W_1$.

Figure 8E:
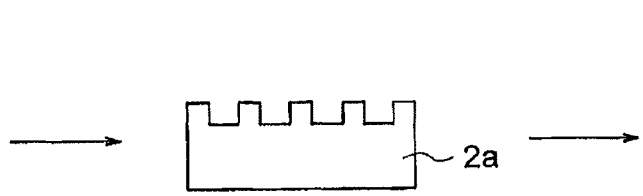
Figure 8F:
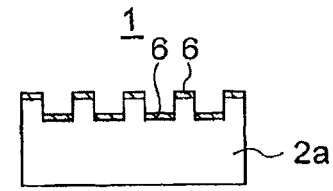

By removing the resist pattern 4a, it is possible to obtain a silicon substrate 2a with an ultrafine pattern (FIG. 8E). A near-field light generating film 6 is deposited on a top surface of each of the convexities and a bottom of each of the concavities of the pattern of concavities and convexities of the silicon substrate 2a (FIG. 8F). The near-field light generating film 6 may be a layer containing at least one element selected from the group consisting of Au, Al, Ag, Cu, Cr, Sb, W, Ni, In, Ge, Sn, Pb, Zn, Pd, and C, or a film stack formed with layers made of some of those materials.

In order to deposit the near-field light generating film 6, the direction of the irradiation source is set to be diagonal relative to plane of the substrate, and the deposition is performed from both the right and left directions. Typical deposition methods are vapor deposition, sputtering, and MBE, but the deposition method to be used here is not limited thereto. By adjusting the irradiation angle relative to the direction of the irradiation source, it is possible to adjust the thickness or thickness ratio of the near-field light generating film 6 to be formed on the top surface of each of the convexities and the bottom of each of the concavities.

In the near-field exposure mask 1 thus formed, a near-field light generating film 6 is formed on the top surface of each of the convexities and the bottom of each of the concavities of the pattern of concavities and convexities formed on the surface of the silicon substrate.

As the substrate, a glass substrate can be used in addition to the silicon substrate.

As will be described later in the descriptions of the ninth embodiment, according to this embodiment, it is possible to provide a pattern forming method by which it is possible to transfer an ultrafine pattern onto a substrate with a high accuracy.

Furthermore, in this embodiment, the near-field exposure mask 1 is formed of the silicon substrate 2a and the near-field light generating film 6. Accordingly, the durability can be increased, and the near-field exposure mask 1 can be formed through simple manufacturing procedures.

Six Embodiment

Figure 9A:
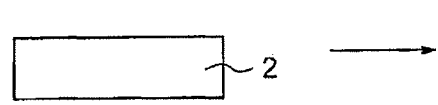
FIGS. 9A through 9F are cross-sectional views illustrating a procedure of manufacturing a near-field exposure mask according to a six embodiment.

Referring now to FIG. 9A though 9F, a near-field exposure mask according to a sixth embodiment is described.

FIG. 9A though 9F are cross-sectional views illustrating a procedure of manufacturing a near-field exposure mask according to the sixth embodiment.

Figure 9B:
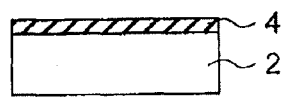
Figure 9C:
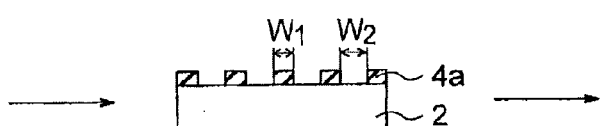
Figure 9D:

First, a silicon substrate 2 of 600 μm in thickness is prepared, and a resist layer 4 of 10 nm to 30 nm in thickness, for example, is applied onto the silicon substrate 2 (FIGS. 9A and 9B). A resist pattern 4a is then formed in the resist layer 4 by using an electron beam lithography technique or EUV lithography technique (FIG. 9C). This resist pattern 4a is a line-and-space pattern in which the line width $W_1$ is 10 nm, and the space width $W_2$ is 10 nm, for example. Accordingly, the height of the resist pattern 4a is 10 nm to 30 nm. Thereafter, the silicon substrate 2 is etched by means of RIE using the resist pattern 4a as a mask (FIG. 9D). As a result, a silicon substrate 2a having a pattern of concavities and convexities on its surface can be obtained (FIG. 9D). The pattern of concavities and convexities of the silicon substrate 2a is a line-and-space pattern in which the line width is $W_2$ and the space width is $W_1$.

Figure 9E:
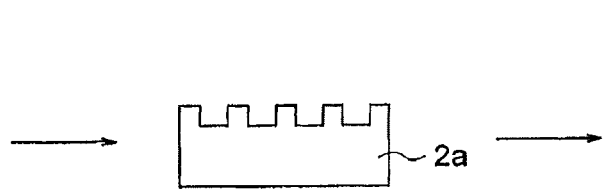
Figure 9F:
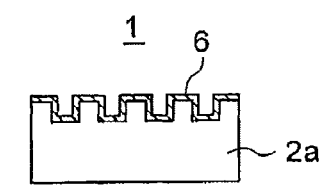

By removing the resist pattern 4a, it is possible to obtain a silicon substrate 2a with an ultrafine pattern (FIG. 9E). A near-field light generating film 6 is deposited on a top surface of each of the convexities, sides connecting the top surface of each convexities, and a bottom of each of the concavities of the pattern of concavities and convexities of the silicon substrate 2a (FIG. 9F). The near-field light generating film 6 may be a layer containing at least one element selected from the group consisting of Au, Al, Ag, Cu, Cr, Sb, W, Ni, In, Ge, Sn, Pb, Zn, Pd, and C, or a film stack formed with layers made of some of those materials.

In order to deposit the near-field light generating film 6, the direction of the irradiation source is set to be diagonal relative to plane of the substrate, and the deposition is performed from both the right and left directions. Typical deposition methods are vapor deposition, sputtering, and MBE, but the deposition method to be used here is not limited thereto. By adjusting the irradiation angle relative to the direction of the irradiation source, it is possible to adjust the thickness or thickness ratio of the near-field light generating film 6 to be formed on the top surface of each of the convexities, the sides connecting the top surface of each of the convexities, and the bottom of each of the concavities of the pattern of concavities and convexities.

In the near-field exposure mask 1 thus formed, a near-field light generating film 6 is formed on the top surface of each of the convexities, the sides connecting the top surface of each of the convexities, and the bottom of each of the concavities of the pattern of concavities and convexities formed on the surface of the silicon substrate.

As the substrate, a glass substrate can be used in addition to the silicon substrate.

As will be described later in the descriptions of the ninth embodiment, according to this embodiment, it is possible to provide a pattern forming method by which it is possible to transfer an ultrafine pattern onto a substrate with a high accuracy.

Furthermore, in this embodiment, the near-field exposure mask 1 is formed of the silicon substrate 2a and the near-field light generating film 6. Accordingly, the durability can be increased, and the near-field exposure mask 1 can be formed through simple manufacturing procedures.

Seventh Embodiment

Figure 10A:
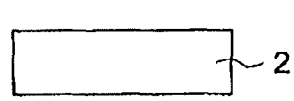
FIGS. 10A through 10F are cross-sectional views illustrating a procedure of manufacturing a near-field exposure mask according to a seventh embodiment.

Referring now to FIG. 10A though 10F, a near-field exposure mask according to a seventh embodiment is described. FIG. 10A though 10F are cross-sectional views illustrating a procedure of manufacturing a near-field exposure mask according to the seventh embodiment.

Figure 10B:
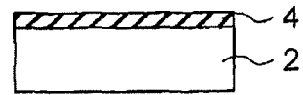
Figure 10C:
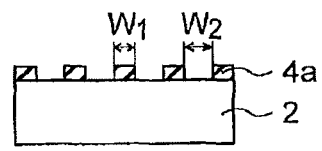

First, a silicon substrate 2 of 600 μm in thickness is prepared, and a resist layer 4 of 10 nm to 30 nm in thickness, for example, is applied onto the silicon substrate 2 (FIG. 10A and 10B). A resist pattern 4a is then formed in the resist layer 4 by using an electron beam lithography technique or EUV lithography technique (FIG. 10C). This resist pattern 4a is a line-and-space pattern in which the line width $W_1$ is 10 nm, and the space width $W_2$ is 10 nm, for example. Accordingly, the height of the resist pattern 4a is 10 nm to 30 nm.

Figure 10D:
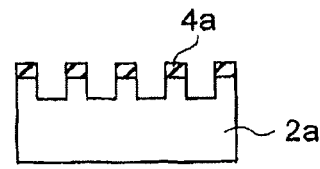

Thereafter, the silicon substrate 2 is etched by means of RIE using the resist pattern 4a as a mask (FIG. 10D). As a result, a silicon substrate 2a having a pattern of concavities and convexities on its surface can be obtained (FIG. 10D). The pattern of concavities and convexities of the silicon substrate 2a is a line-and-space pattern in which the line width is $W_1$ and the space width is $W_2$.

Figure 10E:
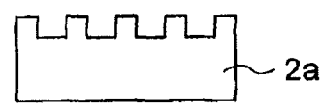
Figure 10F:
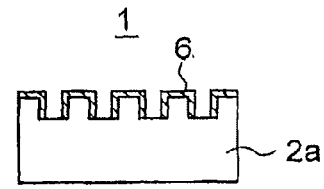

By removing the resist pattern 4a, it is possible to obtain a silicon substrate 2a with an ultrafine pattern (FIG. 10E). A near-field light generating film 6 is deposited on a top surface and sides of each of the convexities of the pattern of concavities and convexities of the silicon substrate 2a (FIG. 10F). The near-field light generating film 6 may be a layer containing at least one element selected from the group consisting of Au, Al, Ag, Cu, Cr, Sb, W, Ni, In, Ge, Sn, Pb, Zn, Pd, and C, or a film stack formed with layers made of some of those materials.

In order to deposit the near-field light generating film 6, the direction of the irradiation source is set to be diagonal relative to plane of the substrate, and the deposition is performed from both the right and left directions. Typical deposition methods are vapor deposition, sputtering, and MBE, but the deposition method to be used here is not limited thereto. By adjusting the irradiation angle relative to the direction of the irradiation source, it is possible to adjust the thickness or thickness ratio of the near-field light generating film 6 to be formed on the top surface and the sides of each of the convexities of the pattern of concavities and convexities.

In the near-field exposure mask 1 thus formed, a near-field light generating film 6 is formed on the top surface and the sides of each of the convexities of the pattern of concavities and convexities formed on the surface of the silicon substrate.

As the substrate, a glass substrate can be used in addition to the silicon substrate.

As will be described later in the descriptions of the ninth embodiment, according to this embodiment, it is possible to provide a pattern forming method by which it is possible to transfer an ultrafine pattern onto a substrate with a high accuracy.

Furthermore, in this embodiment, the near-field exposure mask 1 is formed of the silicon substrate 2a and the near-field light generating film 6. Accordingly, the durability can be increased, and the near-field exposure mask 1 can be formed through simple manufacturing procedures.

Eighth Embodiment

Figure 11A:
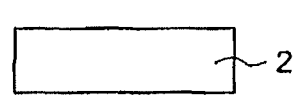
FIGS. 11A through 11F are cross-sectional views illustrating a procedure of manufacturing a near-field exposure mask according to an eighth embodiment.

Referring now to FIG. 11A though 11F, a near-field exposure mask according to an eighth embodiment is described. FIG. 11A though 11F are cross-sectional views illustrating a procedure of manufacturing a near-field exposure mask according to the eighth embodiment.

Figure 11B:
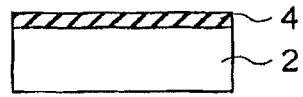
Figure 11C:
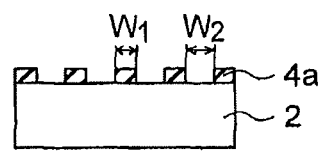

First, a silicon substrate 2 of 600 µm in thickness is prepared, and a resist layer 4 of 10 nm to 30 nm in thickness, for example, is applied onto the silicon substrate 2 (FIGS. 11A and 11B). A resist pattern 4a is then formed in the resist layer 4 by using an electron beam lithography technique or EUV lithography technique (FIG. 11C). This resist pattern 4a is a line-and-space pattern in which the line width $W_1$ is 10 nm, and the space width $W_2$ is 10 nm, for example. Accordingly, the height of the resist pattern 4a is 10 nm to 30 nm.

Figure 11D:
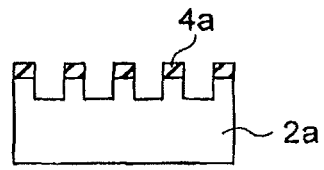

Thereafter, the silicon substrate 2 is etched by means of RIE using the resist pattern 4a as a mask (FIG. 11D). As a result, a silicon substrate 2a having a pattern of concavities and convexities on its surface can be obtained (FIG. 11D). The pattern of concavities and convexities of the silicon substrate 2a is a line-and-space pattern in which the line width is $W_2$ and the space width is $W_1$.

Figure 11E:
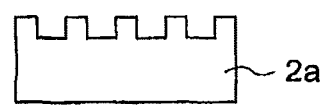
Figure 11F:
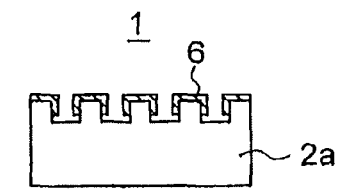

By removing the resist pattern 4a, it is possible to obtain a silicon substrate 2a with an ultrafine pattern (FIG. 11E). A near-field light generating film 6 is deposited on a top surface of each of the convexities and sides connecting the top surface of each of the convexities of the pattern of concavities and convexities of the silicon substrate 2a (FIG. 11F). The near-field light generating film 6 may be a layer containing at least one element selected from the group consisting of Au, Al, Ag, Cu, Cr, Sb, W, Ni, In, Ge, Sn, Pb, Zn, Pd, and C, or a film stack formed with layers made of some of those materials.

In order to deposit the near-field light generating film 6, the direction of the irradiation source is set to be diagonal relative to plane of the substrate, and the deposition is performed from both the right and left directions. Typical deposition methods are vapor deposition, sputtering, and MBE, but the deposition method to be used here is not limited thereto. By adjusting the irradiation angle relative to the direction of the irradiation source, it is possible to adjust the thickness or thickness ratio of the near-field light generating film 6 to be formed on the top surface and the sides of each of the convexities of the pattern of concavities and convexities.

In the near-field exposure mask 1 thus formed, a near-field light generating film 6 is formed on the top surface and the sides of each of the convexities of the pattern of concavities and convexities formed on the surface of the silicon substrate.

As the substrate, a glass substrate can be used in addition to the silicon substrate.

As will be described later in the descriptions of the ninth embodiment, according to this embodiment, it is possible to provide a pattern forming method by which it is possible to transfer an ultrafine pattern onto a substrate with a high accuracy.

Furthermore, in this embodiment, the near-field exposure mask 1 is formed of the silicon substrate 2a and the near-field light generating film 6. Accordingly, the durability can be increased, and the near-field exposure mask 1 can be formed through simple manufacturing procedures.

Ninth Embodiment

Figure 12:
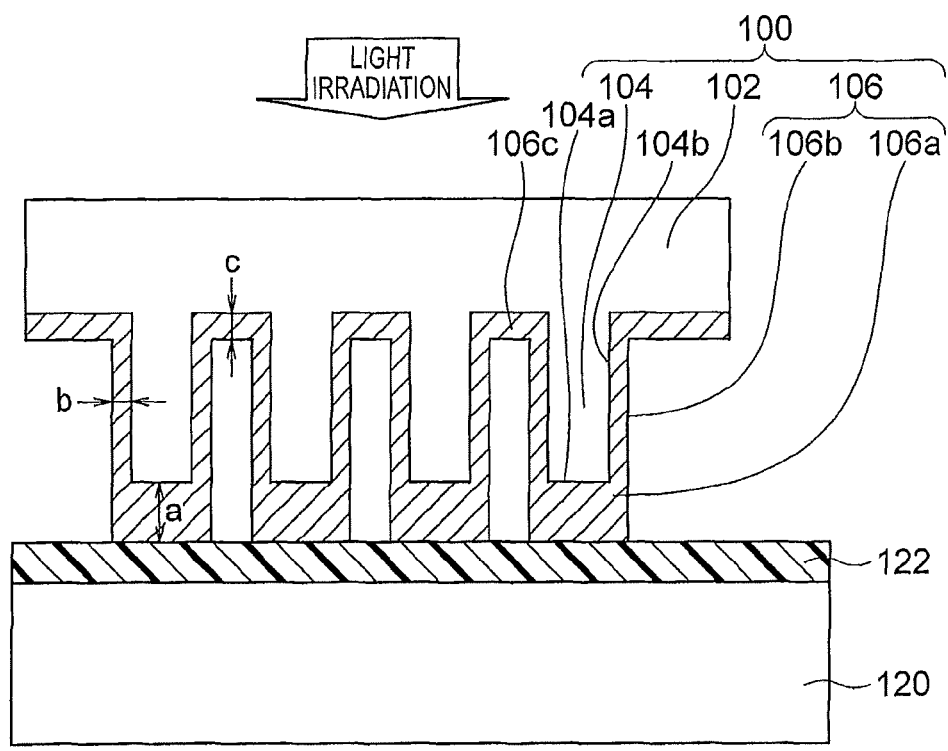
FIG. 12 is a cross-sectional view for explaining a near-field optical lithography method according to a ninth embodiment.

Referring now to FIG. 12, a near-field optical lithography method according to a ninth embodiment is described.

A near-field exposure method and a near-field optical nanoimprint method are lithography techniques involving near-field light generating members as masks, and are designed for generating near-field light from light having a longer wavelength than the wavelength of propagating light that is normally emitted. It is known that, with the use of near-field light, a photochemical reaction occurs in the resist at a shorter wavelength at which a reaction does not normally occur. Accordingly, no reactions occur at portions irradiated only with propagating light from which near-field light is not generated, but a photochemical reaction occurs only at the portions where near-field light exists, to enable patterning. This is a phenomenon that occurs both in the case of a near-field exposure method and in the case of a near-field optical nanoimprint method.

Near-field light with high intensity is focused locally onto portions with small radii of curvature in the surface. That is, the electrical field intensity of near-field light tends to become higher at portions near the corners. Therefore, in a light exposure using nanoimprint or a mask, patterning is performed depending on the line shapes of the mask. However, if an exposure or imprint curing occurs only at both sides of the mask in the mask width direction, the patterned linewidth becomes smaller by half or more, and the number of lines is doubled. That is, with the use of near-field light, finer patterning can be performed.

The near-field optical lithography method according to the ninth embodiment uses the near-field exposure mask 1 of any of the first through eights embodiments as a near-field exposure mask (near-field light generating member). In FIG. 12, the near-field exposure mask according to the sixth embodiment shown in FIG. 9F is used. As shown in FIG. 12, in a near-field light generating member 100, at least one convex portion 104 is formed on one of the facing surfaces of a transparent substrate 102. The substrate 102 and the convex portion 104 can be made of different materials from each other, or may be made of the same material. Examples of materials of the respective substrates include Si, $SiO_2$, sapphire, magnesium fluoride, zinc sulfide, zinc selenide, and calcium fluoride. The convex portion 104 includes a top end 104a and sides 104b. The sides 104b are side faces that connect the top end 104a and the substrate 102. The top end 104a and the sides 104b are covered with a near-field light generating layer 106 that is made of metal, CNT (carbon nanotube), or graphene. Specifically, the near-field light generating layer 106 includes a first layer 106a covering the top end 104a of the convex portion 104, and a second layer 106b covering the sides 104b of the convex portion 104. Further, a third layer 106c made of metal, CNT (carbon nanotube), or graphene can be or may not be formed in the region other than the convex portion 104 on the surface of the substrate 102 on which the convex portion 104 is formed.

The near-field light generating member 100 and a substrate 120, on which a light-curable resin layer 122 is formed, are positioned so that and the light-curable resin layer 122 faces the convex portion 104. In this situation, light is emitted onto the back surface of the near-field light generating member 100, or onto the surface on the opposite side from the surface on which the convex portion 104 is formed. In this manner, near-field light is generated from the near-field light generating layer 106, and the photosensitive resin layer 122 is exposed by the near-field light. If the substrate 120 is a transparent substrate, light can be emitted onto the substrate 120.

Figure 13A:
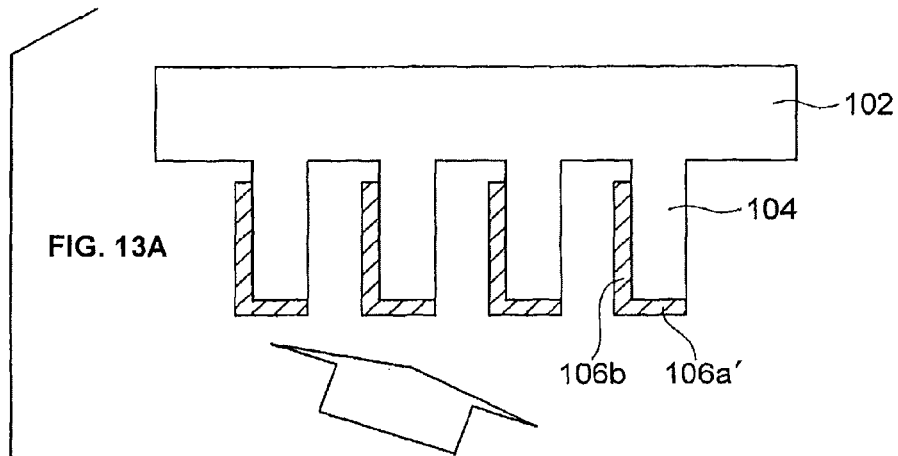
FIGS. 13A and 13B are cross-sectional views for explaining a method of forming a near-field light generating film of a near-field exposure mask according to the fifth to the eighth embodiments.
Figure 13B:
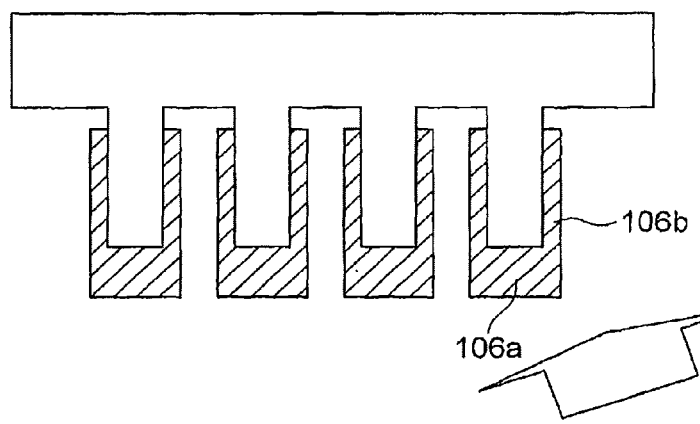

In order to deposit the near-field light generating film 6, the direction of the irradiation source is set to be diagonal relative to plane of the substrate, and the deposition is performed from both the right and left directions, as shown in FIGS. 13A and 13B. Typical deposition methods are vapor deposition, sputtering and MBE, but the deposition method to be used here is not limited thereto. By adjusting the irradiation angle relative to the direction of the irradiation source, it is possible to adjust the thickness or thickness ratio of each of the first layer 106a, the second layer 106b, and the third layer 106c.

Metal, CNT (carbon nanotube), and graphene has the function to generate and guide near-field light. Near-field light generated by any of those materials has excellent polarization components in the traveling direction (the direction from the substrate toward the top end of the convex portion in the side faces of the convex portion) or has excellent so-called z-polarized light (light polarized in the traveling direction), compared with the polarization components of general plane wave propagation light that are perpendicular to the traveling direction. Therefore, the near-field light is suitable for the use in the lithography technology, and has double patterning properties. Accordingly, stronger double patterning can be performed, if a resist formed by the lithography technology or the polymerization initiator of a curable resin in a nanoimprint method strongly reacts to z-polarized light.

Further, by reducing the width of the convex portion, fine patterning, if not double patterning, can be performed.

As described above, according to this embodiment, it is possible to provide a pattern forming method by which it is possible to transfer an ultrafine pattern onto a substrate with a high accuracy.

Tenth Embodiment

Figure 14A:
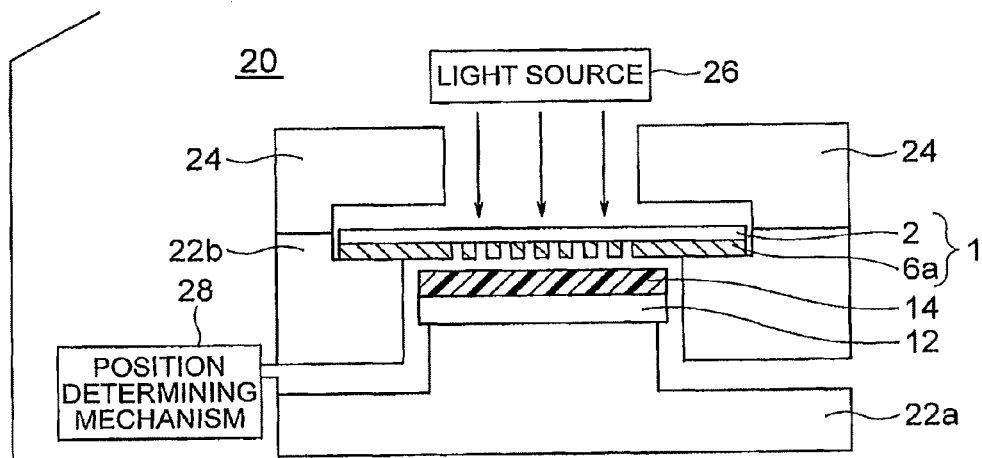
FIGS. 14A and 14B are cross-sectional views illustrating a near-field exposure apparatus according to a tenth embodiment.
Figure 14B:
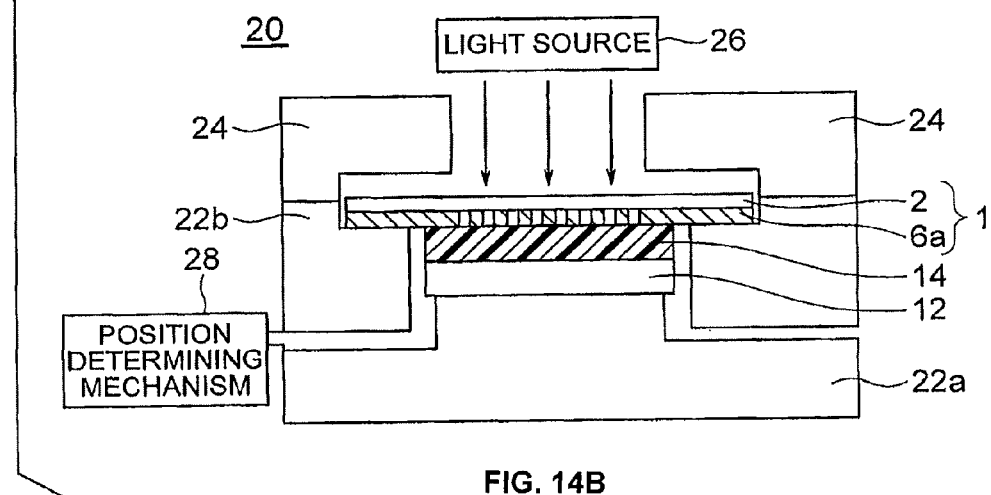

Referring now to FIGS. 14A and 14B, a near-field exposure apparatus according to a tenth embodiment is described. A near-field exposure apparatus 20 of the tenth embodiment performs exposures, using the near-field exposure mask 1 of the fourth embodiment shown in FIG. 7, for example. The near-field exposure apparatus 20 includes: a mount table 22a on which a to-be-processed substrate 12 having a resist 14 applied thereto is placed, a supporting table 22b that supports the face of the near-field exposure mask 1 on which the near-field light generating film pattern 6a is formed; and a mask 24 to allow light from a light source 26 to irradiate the region of the near-field exposure mask 1 on which the near-field light generating film pattern 6a is formed. As shown in FIGS. 14A and 14B, light is emitted from the light source 26 located on the side where there is the silicon substrate 2 of the near-field exposure mask 1, and the near-field light generating film pattern 6a and the resist 14 applied onto the to-be-exposed substrate 12 are positioned to face each other. Incidentally, the near-filed exposure apparatus 20 of the tenth embodiment may be exposed to light using the near-field exposure mask 1 of any of the first to the third embodiments, or the near-field exposure mask 1 of any of the fifth to the eighths embodiments.

FIG. 14A is a cross-sectional view showing a situation where the near-field light generating film pattern 6a of the near-field exposure mask 1 is not in contact with the resist 14 applied onto the to-be-processed substrate 12. FIG. 14B is a cross-sectional view showing a situation where the near-field light generating film pattern 6a of the near-field exposure mask is in contact with the resist 14 applied onto the to-be-processed substrate 12.

The near-field exposure apparatus 20 of the tenth embodiment includes the light source 26 used for near-field exposures, and a position determining mechanism 28. The position determining mechanism 28 moves either of the near-field exposure mask 1 and the to-be-processed substrate 12, onto which the resist 14 is applied, for determining the position thereof so that the upper surface of the near-field light generating film pattern 6a of the near-field exposure mask 1 and the surface of the resist 14 applied onto the to-be-processed substrate 12 are "in contact with" each other. The position determining mechanism 28 is driven by, for example, a vacuum pump or the like.

The feature herein that the upper surface of the near-field light generating film pattern 6a and the surface of the resist 14 applied onto the to-be-processed substrate 12 are "in contact with" each other means that they are in a range where the effect of near-field light reaches (for example, in a range of −10 nm or more to less than 0 nm, or more than 0 nm to 10 nm or less). Thus, the upper surface of the near-field light generating film pattern 6a and the surface of the resist 14 are not necessarily in contact with each other actually. That is, if the distance between the upper surface of the near-field light generating film pattern 6a and the surface of the resist 14 applied onto the to-be-processed substrate 12 is in a range of −10 nm or more to less than 0 nm or more than 0 nm to 10 nm or less, the effect of near-field light reaches thereto, resulting in that it is possible to transfer a ultrafine pattern onto the substrate accurately. Herein, a minus distance means that upper surface of the near-field light generating film pattern 6a sinks into the surface of the resist 14.

When the near-field light generating film pattern 6a is not in contact with the resist 14 applied onto the to-be-processed substrate 12 as shown in FIG. 14A, the position determining mechanism 28 does not operate, and the light source 26 is in an OFF state. On the other hand, when the near-field light generating film pattern 6a is in contact with the resist 14 applied onto the to-be-processed substrate 12 as shown in FIG. 14B, the position determining mechanism 28 operates, and the light source 26 is in an ON state. That is, by activating the position determining mechanism 28, the near-field light generating film pattern 6a is brought into contact with the resist 14. With the near-field light generating film pattern 6a being in contact with the resist 14, the back surface of the near-field exposure mask 1 is irradiated with the light from the light source 26. It should be noted that the light source 26 needs to be a light source that generates light of 1100 nm or longer in wavelength, because light of 1100 nm or longer in wavelength can pass through Si.

As a result, near-field light is generated from the opening portions of the near-field light generating film pattern 6a of the near-field exposure mask 1, and a pattern latent image is transferred to the resist 14 on the to-be-processed substrate 12. The exposure is preferably performed where the near-field exposure mask 1 and the resist 14 formed on the to-be-processed substrate 12 are in good contact with each other (without any non-contact region) in the area in which the pattern is to be formed. In the tenth embodiment, exposures are performed with light entering from the opposite side from the side on which the near-field light generating film pattern 6a of the near-field exposure mask 1 is formed. However, as will be described later, exposures may be performed with light entering from the side on which the near-field light generating film pattern 6a of the near-field exposure mask 1 is formed.

In this manner, it is possible to transfer a ultrafine pattern onto the to-be-processed substrate 12 accurately by exposing the resist 14 to near-field light, developing the resist 14 thus exposed to form a resist pattern, and etching the to-be-processed substrate 12 using this resist pattern as a mask.

As the resist 14 used in the tenth embodiment, either a positive resist or negative resist can be used. Examples of positive resists that can be used include a diazonaphthoquinone-novolac resist and a chemically-amplified positive resist. Examples of negative resists that can be used include a chemically-amplified negative resist, a photo cation polymerizable resist, a photo radical polymerizable resist, a polyhydroxystyrene-bisazide resist, a cyclized rubber-bisazide resist, and a polyvinyl cinnamate resist. With the use of a chemically-amplified positive resist and a chemically-amplified negative resist, a pattern with a low line edge roughness is formed. Accordingly, the use of a chemically-amplified positive resist or chemically-amplified negative resist is particularly preferable in this embodiment.

In this embodiment, a known light source can be used as the near-field light source 26. For example, a laser having a wavelength of 0.35 μm to 20 μm or light-emitting diode can be used. One or more such light sources can be used. Since semiconductor lasers are less expensive have higher power, the use of a semiconductor laser or light-emitting diode is more preferable in this embodiment.

As described above, it is possible to accurately transfer a ultrafine pattern onto a substrate by performing exposure using the near-field exposure apparatus of this embodiment to form the pattern.

Eleventh Embodiment

The ninth embodiment is a pattern forming method in which the light is emitted onto the back surface of the near-field exposure mask 100 (onto the surface of the Si substrate 102 on the opposite side from the surface on which the near-field light generating film pattern is formed). However, a near-field exposure method according to an eleventh embodiment is a pattern forming method in which light is emitted onto a front surface of the near-field exposure mask 1, or onto the surface on which the near-field light generating film pattern 6*a* is formed. The eleventh embodiment is described referring to FIG. 15A though 15D.

Figure 15A:
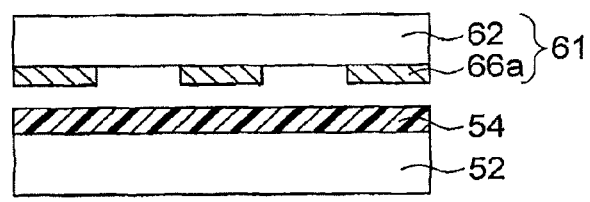
FIGS. 15A through 15D are cross-sectional views for explaining a pattern forming method according to an eleventh embodiment.

As in the case of the ninth embodiment, a resist layer 54 is applied onto a Si substrate 52 by a spin coating method or the like, as shown in FIG. 15A. Subsequently, as shown in FIG. 15A, a near-field exposure mask 61, in which a near-field light generating film pattern 66*a* is formed on a Si substrate 62, is prepared. The near-field exposure mask 61 has the same structure as the fourth embodiment.

Figure 15B:
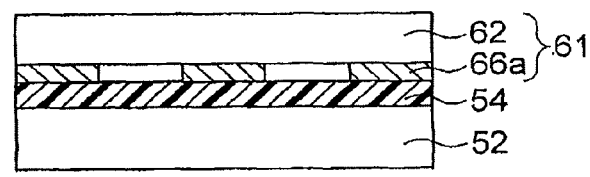
Figure 15C:
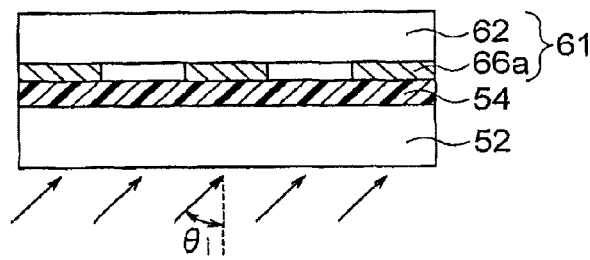
Figure 15D:
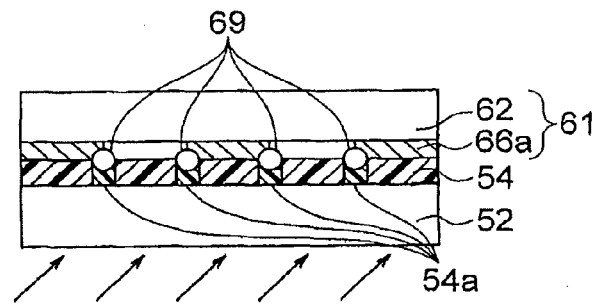

Then, as shown in FIG. 15B, the positioning is performed so that the near-field light generating film pattern 66*a* is in contact with the surface of the resist layer 54. Then, light of 1550 nm in wavelength is emitted from the side of Si substrate 52, on the opposite side of which the resist is applied. The incident light is p-polarized. Furthermore, the light is incident with a diagonal angle of θi. Although the light propagates through the resist layer 54, the resist is not sensitive to the light since the wavelength used for the light is far longer than the wavelength to which the resist is sensitive. However, the light reaching the interface between the near-field light generating film pattern 66*a* of the near-field exposure mask 61 and the resist layer 54 is converted to a near-field light 69 at the edge portion of the near-field light generating film pattern 66*a*. A resist portion 54*a* in the vicinity of the region where the near-field light 69 is generated is dissociated through a procedure of multiple-stage transition. Thus, even if light is emitted from the front side of the near-field exposure mask 61, it is possible to form an ultrafine pattern.

An LED with a wavelength of 1550 nm is used as an exposing light source to perform an exposure process with an incident power of 30 mW for two hours. The Si substrate 52 including the resist layer 54 thus exposed is developed by being soaked in a developer for 30 seconds, cleaned by pure water, and cleared of water by means of air blow. The exposed resist portion 54*a* is dissolved into the developer, thereby forming a pattern corresponding to the edge portion of the near-field light generating film pattern 66*a*. In this manner, it is possible to form a pattern of 50 nm in width and 50 nm in depth along the edge portion of the near-field light generating film pattern 66*a*.

Thus, it is possible to transfer an ultrafine pattern onto the substrate to be processed 52 by exposing the resist 54 to near-field light, developing the resist 54 thus exposed to form a resist pattern, and etching the substrate to be processed 52 using the resist pattern as a mask.

Furthermore, when light is emitted from the front side of the near-field exposure mask 61 as in the eleventh embodiment, the near-field light is excited more easily in the edge portion of the near-field light generating film pattern 66*a* of the near-field exposure mask 61 as compared with the case where light is emitted from the back side of the near-field exposure mask as in the ninth embodiment. The reason for this is that when light is emitted from the back side of the near-field exposure mask 61, near-field light is generated in the edge portion of the near-field light generating film pattern 66*a* on the side of the Si substrate 62, and then moves to the edge portion of the near-field light generating film pattern 66*a* on the side of the resist layer 54, thereby sensitizing the resist layer 54. When the near-field light moves from the edge portion of the near-field light generating film pattern 66*a* on the side of the Si substrate 62 to the edge portion of the near-field light generating film pattern 66*a* on the side of the resist layer 54, part of the near-field light is absorbed by the near-field light generating film pattern 66*a*, resulting in that the intensity of the near-field light decreases. In contrast, when light is emitted from the front side of the near-field exposure mask 61, the light propagates through the resist layer 54, and then near-field light is generated in the edge portion of the near-field light generating film pattern 66*a* on the side of the resist layer 54. Accordingly, as compared with the case where light is emitted from the back side of the near-field exposure mask 61, no decrease in the intensity of near-field light is caused by the near-field light generating film pattern 66*a*.

As described above, according to this embodiment, it is possible to transfer an ultrafine pattern onto a substrate accurately.

Twelfth Embodiment

Referring now to FIGS. 16A through 16D, a resist pattern forming method and a device manufacturing method according to a twelfth embodiment are described.

In the twelfth embodiment, the near-field exposure mask of the fourth embodiment and the near-field exposure apparatus 20 of the tenth embodiment are used, for example.

First, the to-be-processed substrate 12 is prepared, and a light-curable resin is applied onto the to-be-processed substrate 12. The light-curable resin may be a single layer. In this embodiment, however, the light-curable resin has a double-layer resist structure formed by stacking a resist layer 15 and a light-curable resin layer 16 in this order on the to-be-processed substrate 12. After that, the to-be-processed substrate 12 and the near-field exposure mask 1 according to the fourth embodiment are placed and arranged on the near-field exposure apparatus (not shown) according to the tenth embodiment in such a manner that the near-field light generating film pattern 6*a* of the near-field exposure mask 1 faces the resist layer 14 on the to-be-processed substrate 12

(FIG. 16A). The near-field light generating film pattern 6a of the near-field exposure mask 1 and the light-curable resin layer 14 on the to-be-processed substrate 12 are brought into contact with each other, and a near-field exposure is performed. As a result, near-field light leaks along the edge portions of the near-field light generating film pattern 6a, to cure the light-curable resin layer 14. In this embodiment, the resist layer 14 is a double-layer structure. Therefore, the upper light-curable resin layer 16 is exposed with the near-field light.

The near-field exposure mask 1 is then detached from the to-be-processed substrate 12, and a pattern 16a is formed on the resist layer 15, as shown in FIG. 16B. With the pattern 16a being used as a mask, patterning is performed on the resist layer 15 by using a lithography technique, to form a resist pattern 15a (FIG. 16C). As a result, a pattern 14a having a stack structure formed with the resist pattern 15a and the pattern 16a is formed on the to-be-processed substrate 12 (FIG. 16D).

With the pattern 14a being used as a mask, dry etching or wet etching is performed. After the mask is removed, a semiconductor process including metal vapor deposition, lift-off, and plating is performed on the to-be-processed substrate 12, to process the to-be-processed substrate 12. In this manner, a desired device is formed in the to-be-processed substrate 12.

As the light-curable resin 16 used in this embodiment, a modified acrylate resin, a methacrylate resin, a modified epoxy resin, a polyester acrylate resin, an epoxy acrylate resin, an urethane acrylate resin, and so on can be used.

As the resist layer 15 used in this embodiment, either a positive resist or negative resist can be used, as long as it has photosensitivity to the light source to be used. Examples of positive resists that can be used include a diazonaphthoquinone-novolac resist and a chemically-amplified positive resist. Examples of negative resists that can be used include a chemically-amplified negative resist, a photo cation polymerizable resist, a photo radical polymerizable resist, a polyhydroxystyrene-bisazide resist, a cyclized rubber-bisazide resist, and a polyvinyl cinnamate resist. With the use of a chemically-amplified positive resistor and a chemically-amplified negative resist, a pattern with high linewidth accuracy is formed.

As the to-be-processed substrate 12, various kinds of substrates can be used, such as a semiconductor substrate made of Si, GaAs, InP, or the like, an insulating substrate made of glass, quartz, BN, or the like, or any of those substrates on which one or more films made of a resist, a metal, an oxide, or a nitride are formed.

The propagation depth of near-field light is normally 100 nm or less. To form the pattern 14a of 100 nm or more in height by near-field optical lithography, a resist layer having a multilayer structure is preferably used. That is, it is preferable to use the resist layer 14 having a double-layer structure in which the light-curable resin layer 16 having endurance to oxygen dry etching is applied onto the lower resist layer 15 that is applied onto the to-be-processed substrate 12 and can be removed by dry etching. Alternatively, it is possible to use a resist layer having a three-layer structure in which an oxygen plasma etching endurance layer (not shown) is formed on the lower resist layer 15 that is applied onto the to-be-processed substrate 12 and can be removed by dry etching, and the resist layer 16 is further applied onto the oxygen plasma etching endurance layer.

The applications of the resists 14, 15, and 16 can be performed by using known application apparatuses and known methods such as potting, inkjet, a spin coater, a dip coater, and a roller coater, and so on.

The film thicknesses are comprehensively determined by taking into account the processing depth of the to-be-processed substrate 12, and the plasma etching endurances and light intensity profiles of the resists. Normally, the applications are preferably performed so that the film thicknesses fall within the range of 10 nm to 300 nm after prebake.

Further, prior to the applications of the resists 14, 15, and 16, one or more of the following high-boiling-point solvents may be added to reduce the film thicknesses after the prebake: benzyl ethyl ether, di-n-hexyl ether, diethylene glycol monomethyl ether, diethylene glycol monoethyl ether, acetonylacetone, isophorone, capronic acid, caprylic acid, 1-octanol, 1-nonanol, benzyl alcohol, benzyl acetate, ethyl benzoate, diethyl oxalate, diethyl maleic acid, γ-butyrolactone, ethylene carbonate, propylene carbonate, ethylene glycol monophenyl ether acetate, and the like.

After the application, the resist layers are prebaked at 80° C. to 200° C., or more preferably, at 80° C. to 150° C. In the prebake, a heating means such as a hot plate or a hot air drying machine can be used.

After the near-field exposure, the mask 1 is detached from the to-be-processed substrate 12, thereby forming a near-field resist pattern. When the resist pattern 16a formed through a near-field exposure is intended to have a high aspect ratio by a resist layer having a double-layer stack structure, oxygen plasma etching is performed, with the pattern 16a being used as a mask. Examples of oxygen-containing gases that can be used in the oxygen plasma etching include oxygen, a mixed gas of oxygen and an inert gas such as argon gas, or a mixed gas of oxygen and carbon monoxide, carbon dioxide, ammonia, dinitrogen monoxide, sulfur dioxide, or the like.

When the resist pattern 16a formed through a near-field exposure is intended to have a high aspect ratio by a resist layer having a three-layer stack structure, etching is performed on the oxygen plasma etching endurance layer, with the pattern 16a being used as a mask. Wet etching or dry etching may be performed as the etching. However, dry etching is more suitable for forming fine patterns, and therefore, is more preferable.

As the wet etching agent, a hydrofluoric acid solution, an ammonium fluoride aqueous solution, a phosphoric acid aqueous solution, an acetic acid aqueous solution, a nitric acid aqueous solution, a cerium ammonium nitrate aqueous solution, or the like can be used, depending on the object to be etched.

Examples of gases for the dry etching include $CHF_3$, $CF_4$, $C_2F_6$, $CF_6$, $CCl_4$, $BCl_3$, $Cl_2$, $HCl$, $H_2$, and $Ar$, and a combination of some of those gases can be used as needed.

After the etching of the oxygen plasma etching endurance layer, oxygen plasma etching is performed in the same manner as in the case of a resist layer having a double-layer stack structure, and the pattern is transferred to the lower resist layer 15.

By using the device manufacturing method according to this embodiment, the following devices or elements (1) through (6) can be manufactured:

(1) a semiconductor device;
(2) a quantum dot laser element having a structure in which GaAs quantum dots of 50 nm in size are two-dimensionally arranged at 50-nm intervals;
(3) a subwavelength structure (SWS) in which conical $SiO_2$ members of 50 nm in size are two-dimensionally arranged at 50-nm intervals on a SiO$_2$ substrate, and a light reflection preventing function is provided;

(4) a photonic crystal optical device or a plasmon optical device having a structure in which 100-nm members made of GaN or a metal are two-dimensionally and periodically arranged at 100-nm intervals;

(5) a biosensor element or a micro total analysis system (µTAS) element that has a structure in which Au fine particles of 50 nm in size are two-dimensionally arranged at 50-nm intervals on a plastic substrate, and uses local plasmon resonance (LPR) or surface-enhanced Raman spectroscopy (SERS); and (6) a nanoelectromechanical system (NEMS) element such as a SPM probe having a sharp structure that is used in scanning probe microscopes (SPM) such as a tunnel microscope, an atomic force microscope, and a near-field optical microscope, and are of 50 nm or less in size.

Example

The following is a description of an example of the twelfth embodiment.

A to-be-processed substrate having a light-curable resin applied thereto is placed on the side of a near-field light generating film pattern of a near-field exposure mask. The to-be-processed substrate 12 used here is a silicon substrate. As the light-curable resin, a resin of Toyo Gosei Co., Ltd. is used.

A 1.5-µm infrared laser is used as the light source for the near-field exposure. The illumination intensity is approximately 85 mJ/cm$^2$ in the i-ray on the upper surface of the mask.

A line-and-space pattern of 20 nm in half pitch and approximately 100 nm in depth is obtained where the exposure time is two minutes, and a line-and-space pattern of 50 nm in half pitch and approximately 100 nm in depth is obtained when the exposure time was one minute.

Thirteenth Embodiment

Referring now to FIGS. 17A through 18C, a pattern forming method according to a thirteenth embodiment is described. The pattern forming method according to the thirteenth embodiment is a method using a nanoimprint method in which a pressing position is controlled.

First, as shown in FIGS. 17A and 17B, a Si substrate 80 is prepared, and a light-curable resin film 82 is formed on the Si substrate 80. The light-curable resin film 82 may be formed by a spinner technique, for example. By the spinner technique, the number of rotations of the spinner is controlled by taking into account the viscosity and solid content of the light-curable resin film 82, and the evaporation rate of the solvent. In this manner, a desired film thickness can be obtained. After the formation of the light-curable resin film 82, prebake can be performed to remove the solvent contained in the film.

As shown in FIG. 17C, a template 90 having a near-field light generating film pattern 94 formed on a Si substrate 92 is prepared. This template 90 can be a near-field exposure mask according to any of the first through eighths embodiments. The light-curable resin film 82 formed on the Si substrate 80 is then brought into contact with the near-field light generating film pattern 94 of the template 90 (FIG. 17D).

With the light-curable resin film 82 and the near-field light generating film pattern 94 being in contact with each other, light is emitted onto the back surface side of the silicon substrate 80 or the opposite side from the side on which the light-curable resin film 82 is formed, as shown in FIG. 17E. The light irradiation is performed for 0.1 to 20 seconds. As a result, near-field light is generated at the edge portions of the near-field light generating film pattern 94 of the template 90, and the generated near-field light reaches the light-curable resin film 82. Since the light emitted in this embodiment is so-called nonresonant light, the light-curable resin film 82 reacts directly to the emitted light, but is not chemically changed at all when the irradiation time and intensity are adjusted. In the step illustrated in FIG. 17D, the distance between the Si substrate 80 having the light-curable resin film 82 applied thereto and the template 90 can be determined based on the wavelength of the emitted light. In this embodiment, the template 90 is a template having the near-field light generating film pattern 94 formed on the Si substrate 92. However, the template 90 can be a concave-convex mold, and the material of the concave-convex mold can be Si.

The light intensity of the near-field light is higher at the concave and convex edge portions that correspond to the pattern 94 of the template 90. The light-curable resin film 82 reacts to the generated near-field light due to the near-field light generated. As a result, the light-curable resin film 82 is cured at local regions 82a corresponding to the above-mentioned edge portions, as shown in FIG. 18A.

As shown in FIG. 18B, the template 90 is detached from the Si substrate 80. Edge neighborhood portions 82a formed by curing the light-curable resin film 82 with the near-field light generated in the step illustrated in FIG. 17E and the light-curable resin film portions 82b, in which no near-field light is generated and which are located outside the edge neighborhood portions 82a, remain on the Si substrate 80.

The light-curable resin film portions 82b remaining on the Si substrate 80 is used as a mask, and etching is performed on the Si substrate 80. In this manner, a silicon substrate 80a having a fine pattern can be obtained (FIG. 18C).

The near-field light generating film pattern 94 of the template 90 is made of a metal containing at least one element selected from the group consisting of Au, Al, Ag, Cu, and Cr, and the film thickness of the pattern 94 may be greater than 0 nm and not greater than 40 nm. The light to be emitted can have a wavelength of 0.36 µm to 5.0 µm. Further, light can be emitted onto the template 90. The light-curable resin film 82 may be formed so that it is not cured by light having a wavelength of 1 µm to 5.0 µm.

The concave edge portions of the concave-convex mold serve as an even finer pattern. That is, by the nanoimprint method to which this embodiment is applied, the light-curable resin film can be locally cured by near-field light rapidly enhanced at the concave and convex edge portions, to form a sharp detachment face at the time of detachment. In this manner, a much finer pattern than a pattern formed with concavities and convexities can be formed. At the concave and convex edge portions, sharper electrical field gradients exist, depending on emitted light. However, a diabatic process that reacts only in those regions can be used. Accordingly, fine patterning of 10 nm or smaller can be performed with high precision.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A pattern forming method for forming a pattern using a near-field exposure mask, the pattern forming method comprising:
   forming a resist layer on a substrate;
   preparing a near-field exposure mask, in which a near-field light generating film pattern is formed on a silicon substrate;
   positioning the near-field exposure mask so that the near-field light generating film pattern is in contact with a surface of the resist layer;
   injecting light to a side of the silicon substrate;
   causing the resist layer to react to near-field light generated from the near-field light generating film pattern to generate first portions of the resist layer in which the near-field light is generated and second portions of the resist layer in which no near-field light is generated, the near-field light being generated by the injected light;
   detaching the near-field exposure mask from the silicon substrate,
   removing the first portions of the resist layer and remaining the second portions of the resist layer on the silicon substrate; and
   etching the silicon substrate using the second portions of the resist layer.

2. The method according to claim 1, wherein the light has a wavelength of 1100 nm or more.

3. The method according to claim 1, wherein the light is p-polarized.

4. The method according to claim 1, wherein the light is injected with a diagonal angle.

5. The method according to claim 1, wherein the near-field light generating film is a film containing at least one element selected from the group consisting of Au, Al, Ag, Cu, Cr, Sb, W, Ni, In, Ge, Sn, Pb, Zn, Pd, and C, or a film stack formed with layers made of some of those materials.

6. The method according to claim 1, wherein the near-field light generating pattern has the convexities.

7. The method according to claim 6, wherein a height of at least one of the convexities in the near-field light generating pattern is 50 nm or less.

8. A pattern forming method for forming a pattern using a near-field exposure mask, the pattern forming method comprising:
   forming a resist layer on a substrate;
   forming a light-curable resin on the resist layer;
   preparing a near-field exposure mask, in which a near-field light generating film pattern is formed on a silicon substrate;
   positioning the near-field exposure mask so that the near-field light generating film pattern is in contact with a surface of the light-curable resist layer;
   injecting light to a side of the silicon substrate;
   causing the light-curable resist layer to react to near-field light generated from the near-field light generating film pattern to generate first portions of the curable-light resist layer in which the near-field light is generated and second portions of the light-curable resist layer in which no near-field light is generated, the near-field light being generated by the injected light;
   detaching the near-field exposure mask from the substrate;
   removing the first portions of the light-curable resist layer and remaining the second portions of the light-curable resist layer on the substrate;
   patterning the resist layer using the second portions of the light-curable resist layer to form a pattern of the resist layer; and
   etching the substrate using the second portions of the light-curable resist layer and the pattern of the resist layer.

9. The method according to claim 8, wherein the light has a wavelength of 1100 nm or more.

10. The method according to claim 8, wherein the light is p-polarized.

11. The method according to claim 8, wherein the light is injected with a diagonal angle.

12. The method according to claim 8, wherein the patterning of the resist layer is performed with oxygen plasma etching.

13. The method according to claim 8, wherein the near-field light generating film is a film containing at least one element selected from the group consisting of Au, Al, Ag, Cu, Cr, Sb, W, Ni, In, Ge, Sn, Pb, Zn, Pd, and C, or a film stack formed with layers made of some of those materials.

14. The method according to claim 8, wherein the near-field light generating pattern has the convexities.

15. The method according to claim 14, wherein a height of at least one of the convexities in the near-field light generating pattern is 50 nm or less.

* * * * *